United States Patent [19]

Morita et al.

[11] Patent Number: 5,406,124
[45] Date of Patent: Apr. 11, 1995

[54] INSULATING ADHESIVE TAPE, AND LEAD FRAME AND SEMICONDUCTOR DEVICE EMPLOYING THE TAPE

[75] Inventors: Moritsugu Morita, Kanagawa; Kimiteru Tagawa, Tokyo; Kenji Abe, Kanagawa; Naoshi Mineta, Kanagawa; Takayuki Kubo, Kanagawa; Shigeo Kiba, Kanagawa; Etsuo Ohkawado, Kanagawa; Kenji Tanabe, Kanagawa, all of Japan

[73] Assignee: Mitsui Toatsu Chemicals, Inc., Tokyo, Japan

[21] Appl. No.: 158,417

[22] Filed: Nov. 29, 1993

[30] Foreign Application Priority Data

Dec. 4, 1992 [JP] Japan .................................. 4-325434
Dec. 4, 1992 [JP] Japan .................................. 4-325435
Jan. 5, 1993 [JP] Japan .................................. 5-000259

[51] Int. Cl.⁶ ..................... H01L 23/48; H01L 29/44; H01L 29/52; H01L 29/60
[52] U.S. Cl. .................... 257/783; 257/666; 257/676; 428/473.5; 428/458
[58] Field of Search ................ 257/783, 666, 676; 428/473.5, 458

[56] References Cited

U.S. PATENT DOCUMENTS

| | | | |
|---|---|---|---|
| 4,543,295 | 9/1985 | St. Clair et al. | 428/458 |
| 4,862,245 | 8/1989 | Pashby et al. | 257/660 |
| 4,994,207 | 2/1991 | Edelman et al. | 252/514 |
| 5,086,018 | 2/1992 | Conru et al. | 437/207 |
| 5,140,404 | 8/1992 | Fogal et al. | 257/783 |
| 5,254,412 | 10/1993 | Fujimoto | 428/473.5 |
| 5,319,241 | 6/1994 | Lim | 257/783 |

*Primary Examiner*—Sara W. Crane
*Attorney, Agent, or Firm*—Burns, Doane, Swecker & Mathis

[57] ABSTRACT

An insulating adhesive tape which comprises a base supporting film and an adhesive layer formed on at least one surface thereof, said adhesive layer being formed of a thermoplastic polymer comprising a thermoplastic polyimide, wherein said thermoplastic polymer has a glass transition temperature ranging from 180° C. to 280° C. and an elastic modulus ranging from $10^{10}$ dyne/cm$^2$ to $10^{11}$ dyne/cm$^2$ at 25° C., said modulus including a value ranging from $10^2$ dyne/cm$^2$ to $10^9$ dyne/cm$^2$ at a temperature between 250° C. and 300° C.

16 Claims, 3 Drawing Sheets

INSULATING ADHESIVE TAPE, AND LEAD FRAME AND SEMICONDUCTOR DEVICE EMPLOYING THE TAPE

BACKGROUND OF THE INVENTION

1. Field of the Invention

The present invention relates to an insulating adhesive tape utilized as material in electronic industries, the tape having high electrical insulation and heat-resistance property and capable of being bonded thermo-melting and, lead frames and semiconductor devices employing the tape.

2. Description of Prior Art

In the semiconductor device field, with sophisticated functions, high speed and high integration of LSIs, the IC chips tend to grow in size and an amount of heat generated from the same is increasing.

The specified packages cannot be flexibly changed in size, conversely, it is requested to miniaturize even if IC chips are designed to be large. Hence the gap between the IC chip and the inner wall surface of the IC package tends to be small. There have been problems as for the strength and reliability of the lead frame buried in the package.

In order to overcome such problems, a technology where a lead frame is arranged on the lower or upper portion of an IC chip is proposed and put in practical use, as described in Japanese Patent Application Laid-open No. SHO-61-218139 (1986) and U.S. Pat. No. 4,862,245.

In order to cope with heat increasingly generated from an IC chip, a technology has been proposed and used practically in which a heat spreader with good thermal conductivity and large thermal capacity is proposed and used in place of a chip mounting die or tub and the heat spreader is fixed to inner leads by using an insulating material.

In this device, an adhesive insulating tape is used to prevent the lead frame from being in direct contact with an IC chip or a heat spreader.

Conventionally such an adhesive insulating tape is formed by coating an adhesive resin such as epoxy resin, acrylic resin on a base supporting film (insulating substrate) such as polyimide base film. The insulating tape adheres a lead frame to an IC chip or a heat spreader.

This method has a disadvantage in that ionic impurities, contained in epoxy resin, acrylic resin or the like are eluted by using for a long time, thus destroying a circuit formed on the IC chip so that the reliability of semiconductor devices is degraded.

Moreover, when a short time bonding is executed at high temperatures to improve the productivity, a chemical component of the adhesive agent is partially volatilized and contaminates the surface of the lead frame, IC chip and heat spreader, thus decreasing the affinity to half-melted metal on the surface thereof to thus injure the reliability of the wire bonds electrically connecting an IC chip to a lead frame.

In order to avoid the above problem, curing an adhesive agent at low temperature takes a long time, thus resulting in insufficient level of productivity from industrial view point.

In order to overcome those disadvantages, Japanese Patent Application Laid-open Nos. HEI-2-15663 (1990) and HEI-2-36542 (1990) propose that an amide series or imide series adhesive agent is used for a tape.

However, according to the technology disclosed in the Japanese Patent Application Laid-open No. HEI-2-15663 (1990), after a semicuring polyimide series agent adheres a tape to a lead frame, it is necessary to remove the solvent and to complete the imidization reaction. In this case, since the produced solvent and water contaminate a lead frame, a contaminant removing step is needed, thus leading to an insufficient productivity.

In the adhesive agents for an adhesive insulating tape according to the technology taught by the Japanese Patent Application Laid-open No. HEI-2-36542 (1990), a polyether amide or polyether amideimide being a thermoplastic polymer is used on one surface of a tape adhered with a lead frame while a thermosetting polyimide die bonding agent or epoxy die bonding agent is used on the other surface of the tape adhered with an IC chip.

U.S. Pat. No. 4,862,245 discloses generally a concept in which an adhesive layer is formed on both sides of an alpha barriers such as polyimide film to fix a semiconductor chip and a lead frame, and the adhesive layer being formed by the material selected from epoxy, acryl, silicon, polyimide, arid polyimide containing silicon. It is described that an adhesive layer selected form the group consisting of acryl and epoxy is particularly preferable for the second adhesive layer on the lead frame. Although the prior art publication describes polyimide alone but does not describe the sorts of polyimide adhesive agents and merits of the polyimide. It is not clear that what sort and molecular structure of adhesive agent is optimum.

U.S. Pat. No. 4,543,295 proposes an adhesive polyimide film totally different from the above mentioned adhesive insulating tapes. The film, for example, is formed by coating a thermoplastic polyimide on both surfaces of a polyimide film and may be used to adhere metal and polyimide film.

This tape can adhere a lead frame, a heat spreader for semiconductor device, and an IC chip with a polyimide buffer coat. This tape may possibly improve the disadvantages to be removed of the foregoing adhesive insulating tape: ionic impurities, volatile component and water absorption generated at adhering time.

This specification describes that all sorts of thermoplastic polyimide can be used. However, the exemplified polyimide are only LARC-2, LARC-3 and LARC-4 respectively having a glass transition temperature of 247° C., 269° C. and 297° C. Furthermore, those adhesive agents are relatively brittle. In the adhering condition, since it is stated that the temperature ranges 340° C. to 370° C. and the pressure ranges 3 to 21 kg/cm$^2$ and suitable time is 5 minutes, it takes disadvantageously long time for adhering.

Remarkable advance of current semiconductor related technology and very high productivity to be required have boosted the requirement level in productivity and physical property such as adhesive strength. For example, it is required that the adhesion time (time required for adhesion) is usually not more than 10 seconds, preferably not more than 3 seconds.

In some cases, a semiconductor chip is not covered with polyimide, but is covered only with a ceramic such as silicone nitride or glass such as phosphoric glass.

Under such conditions, the adhesive strength of LARC-2, LARC-3 and LARC-4 to semiconductor material are not enough.

For example, an adhesive tape made from LARC-2 was adhered to 42 NiFe alloy sheet being a lead frame material for semiconductor devices, under the conditions that the temperature is 370° C., the pressure is 21 kg/cm², and the heating adhering time is 5 seconds. The peeling strength of the resultant tape was only 0.5 kg/cm. By extending the thermo-bonding time to 5 minutes, a peeling strength of 1.5 kg/cm was obtained.

It is needless to say that the adhesive strength between a base supporting film and an adhesive agent is important for the adhesive insulating films. However, the thermoplastic polyimide adhesive agent has not been realized that can highly maintain industrially and stably the adhesive strength to both sides of an insulating substrate. Particularly, in the case of the insulating substrate with an imide bond, it seems impossible to obtain a stable, high adhesive strength through corona treatment. A suitable surface treatment has not been found because with the sandblast surface roughing, minute sands remain in the surface to cause impurity ions or a rays. In recent years, Japanese Patent Application Laid-open No. HEI-5-59344 (1993) discloses generally a method for treating physically and chemically the surface of an insulating substrate to be coated and then adhering a certain of thermoplastic polyimide adhesive agent. However, there is no description regarding that what method is optimum to use. Japanese Patent Application Laid-open No. HEI-4-74372 (1992) describes that plasma processing a film such as polyimide film to modify a surface improves the adhesive strength to the adhesive agent. However, only thermosetting acrylic series adhesive agent and thermosetting polyamide adhesive agent are illustrated as adhesive agent. There are no explanations on other sorts of adhesive agents.

The present invention was performed in order to overcome the above mentioned problems. An object of the present invention is to provide an insulating adhesive tape useful for improving the productively and performance of semiconductor devices. Another object of the present invention is to provide a lead frame and a semiconductor device employing the above described tape.

More specifically, it is an object to provide an insulating adhesive tape with good characteristics, reliability, and industrial productivity, which is applicable for bonding a semiconductor to a metal conductor such as lead frame, heat spreader.

Still another object of the present invention is to provide an insulating adhesive tape employing a thermoplastic polyimide which has much better properties than the thermoplastic polyimide disclosed in the U.S. Pat. No. 4,543,295, has a higher adhesive strength to semiconductor material in shorter time, in comparison with the above prior art, and being able to be supplied at low price and in mass production base.

The insulating adhesive tape can maintain its excellent insulating property for a long service period of time. The insulating adhesive tape also has an adhesive temperature (the temperature at which adhesion is carried out) of not more than 400° C., a short adhesion time not more than 10 seconds, and an adhesive strength enough to various semiconductor materials. In adhesion, the insulating adhesive tape also does not occur contamination injurious to the wire-bonding on the surfaces of lead frames and IC chips. The insulating adhesive tape has enough heat resistance, to withstand heating during a wire bonding step so that it does not allow a lead to make a slightest movement, thereby making wire bonding strength high enough to obtain excellent electronic reliability.

Further another object of the present invention is to provide a lead frame and a semiconductor device manufactured using the insulating adhesive tape mentioned above.

SUMMARY OF THE INVENTION

According to the present invention, typical insulating adhesive tapes will be summarized as follows:

1. An insulating adhesive tape which comprises a base supporting film and an adhesive layer formed on at least one surface thereof, said adhesive layer being formed of a thermoplastic polymer comprising a thermoplastic polyimide, wherein said thermoplastic polymer has a glass transition temperature ranging from 180° C. to 280° C. and an elastic modulus ranging from $10^{10}$ to $10^{11}$ dyne/cm² at 25° C., said modulus including a value ranging from $10^2$ dyne/cm² to $10^9$ dyne/cm² at least a temperature between 250° C. and 300° C.

2. The insulating adhesive tape according to Item 1, which is characterized in that the thermoplastic polyimide included in a thermoplastic polymer is formed of a structural unit expressed by the following formula (1), or the polymer molecular terminal of the structural unit of the formula (1) is capped with a dicarboxylic acid anhydride by expressed by the formula (2):

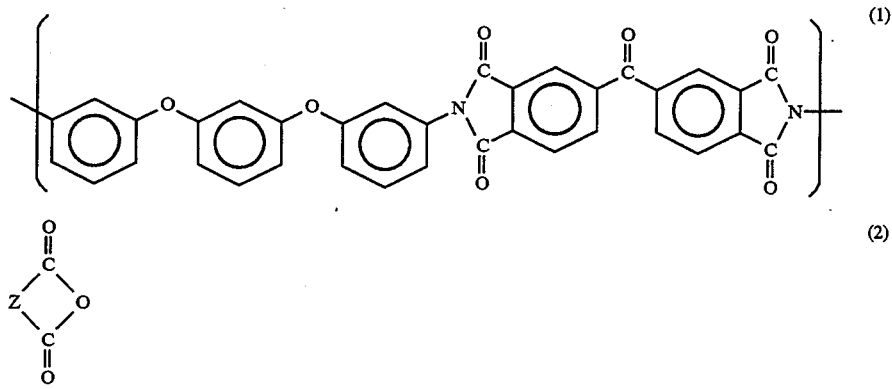

where Z is a bivalent group selected from the group of monocyclic aromatic radical, condensed polycyclic aromatic radical, and non-condensed polycyclic aromatic radical which is directly connected or mutually connected via cross linkers.

3. The adhesive insulating tape according to Item 1, which is characterized in that the thermoplastic polyimide included in a thermoplastic polymer is formed of a structural unit expressed by the following formula (3), and/or the polymer molecular terminal in the structural unit of the formula (3) is capped with a dicarboxylic acid anhydride:

where "m" and "n" show a ratio of a repeated unit to total polymer and includes block copolymer and random copolymer, and, m:n:=1~90:99~10, preferably m:n:30~70:70~30.

thermoplastic polymer layer is formed on only one surface of the insulating film and being thermo-press-bonded to an inner lead of a semiconductor lead frame via the thermoplastic polymer layer to fix the inner lead.

8. An insulating adhesive tape according to any one of Item 1 to Item 6, which is characterized in that the thermoplastic polymer layer is formed on both surfaces of the insulating film and being thermo-press-bonded to

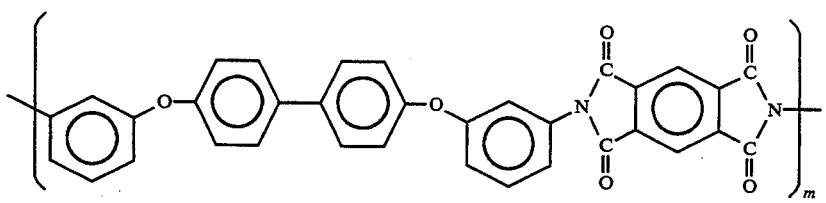

(3)

4. The insulating adhesive tape according to Item 1 which is characterized in that the thermoplastic polyimide included in a thermoplastic polymer is formed of a structural unit expressed by the following formula (4):

an inner lead of a semiconductor lead frame via the thermoplastic polymer layer to fix the inner lead.

9. An insulating adhesive tape according to Item 8, which is characterized in that the insulating adhesive tape is thermo-pressbonded to a predetermined IC chip

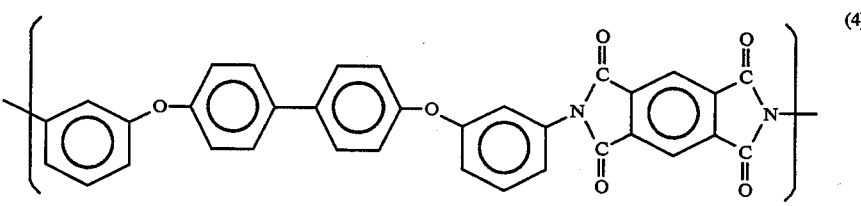

(4)

In later explanations,

PI-X represents a polyimide formed of the structural unit expressed by formula (1).

PI-Xh represents a polyimide which is formed of the structural unit expressed by formula (1) and sealed with dicarboxylic acid anhydride expressed by formula (2).

PI-Y represents a polyimide formed of the structural unit expressed by formula (3).

PI-Yh represents a polyimide which is formed of the structural unit expressed by formula (3) and sealed with dicarboxylic acid anhydride expressed by formula (2).

PI-Z represents a polyimide formed of the structural unit expressed by formula (4).

5. An insulating adhesive tape according to any one of Item 1 to Item 4, which is characterized in that the thermoplastic polymer consists of a silane-coupling-agent-modified thermoplastic polyimide which is prepared by reacting or mixing a thermoplastic polyimide with a silane coupling agent at or after the time when the thermoplastic polyimide is synthesized.

6. An insulating adhesive tape according to any one of Item 1 to Item 5, which is characterized in that the insulating film is a polymer having a polyimide bond and has its surface subjected to a plasma treatment or ozone treatment.

7. An insulating adhesive tape according to any one of Item 1 to Item 6, which is characterized in that the via another surface of the thermoplastic layer to which the inner leads are not bonded.

DESCRIPTION OF THE PREFERRED EMBODIMENTS

With reference to the attached drawings, a further explanation will be made on some embodiments of the present invention. However the present invention should not be limited to only the herein described embodiments.

Figure 1:
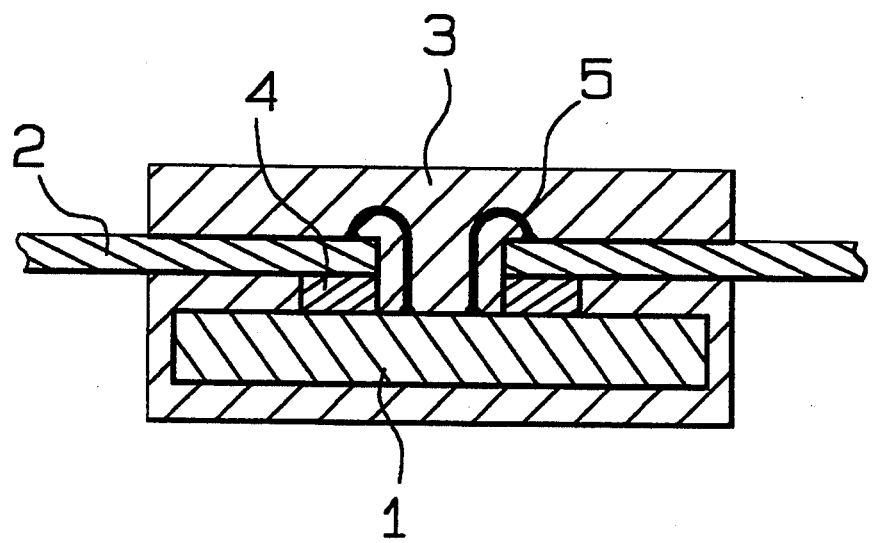
FIG. 1 is a model diagram illustrating the structure of a lead on-chip IC device.
Figure 2:
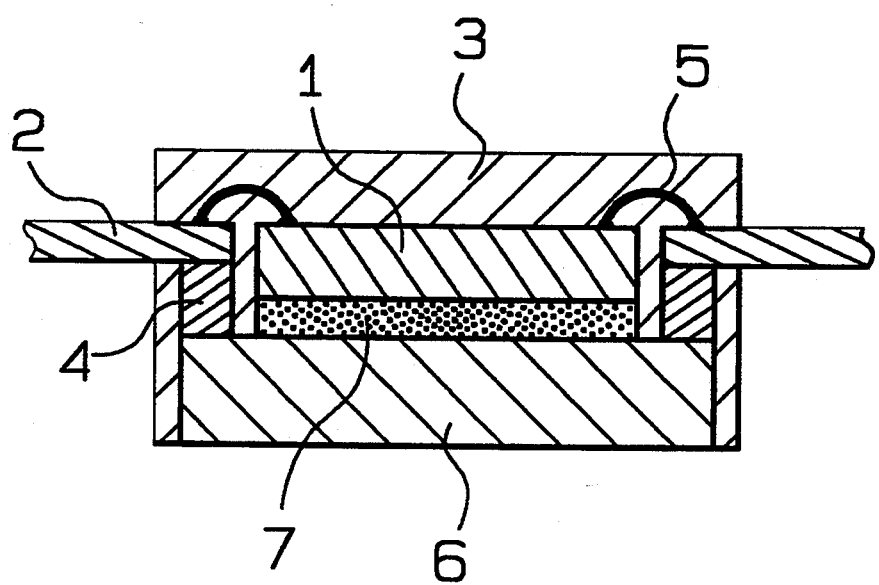
FIG. 2 is a model diagram illustrating the structure of an IC device attached with a heat spreader.

Referring to FIGS. 1 and 2, numeral 1 represents an IC chip, 2 represents a lead frame, 3 represents a resin encapsulating material, 4 represents an insulating adhesive tape, 5 represents a gold wire, 6 represents a heat spreader, and 7 represents a die bonder.

In an IC chip of this type, the IC chip 1 is adhered onto the lead frame 2 with the insulating adhesive tape 4, connected with a very fine gold wire 5, and then encapsulated with the resin encapsulating material 3.

In the IC device of the type shown in FIG. 2, the IC chip 1 is adhered onto the heat spreader 6 using the die bonder 7. The lead frame 2 is also adhered onto the heat spreader 6 with the insulating adhesive tape 4 to electrically connected to each other with a gold wire 5.

Figure 3:
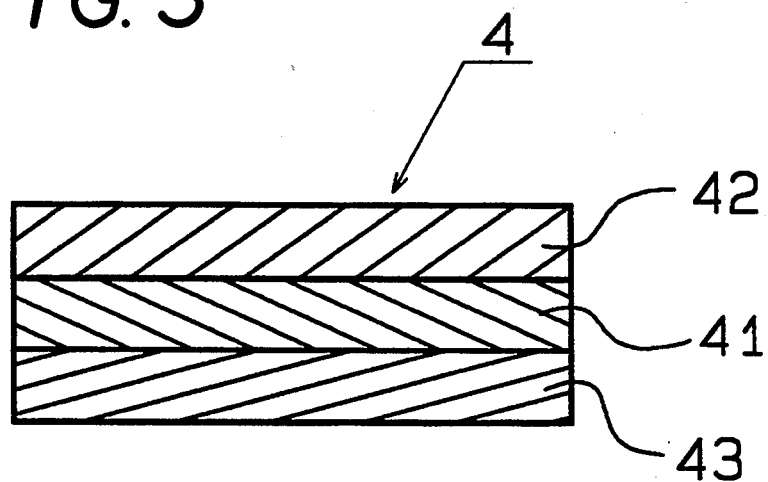
FIG. 3 is a cross-sectional view illustrating the layer structure of an insulating adhesive tape according to the present invention.

A typical layer structure of the insulating adhesive tape according to the present invention is shown in FIG. 3. That is, the insulating adhesive tape 4 according to the present invention is formed, with an adhesive layer 42 of a thermoplastic polymer being coated on one surface of the insulating film 41 to be a base supporting film, and an adhesive layer 43 of a thermoplastic polymer being coated onto the other surface of the insulating film 41, the adhesive layer 43 being a thermoplastic polymer same with or different from that of one surface of the insulating film 41.

Figure 4:
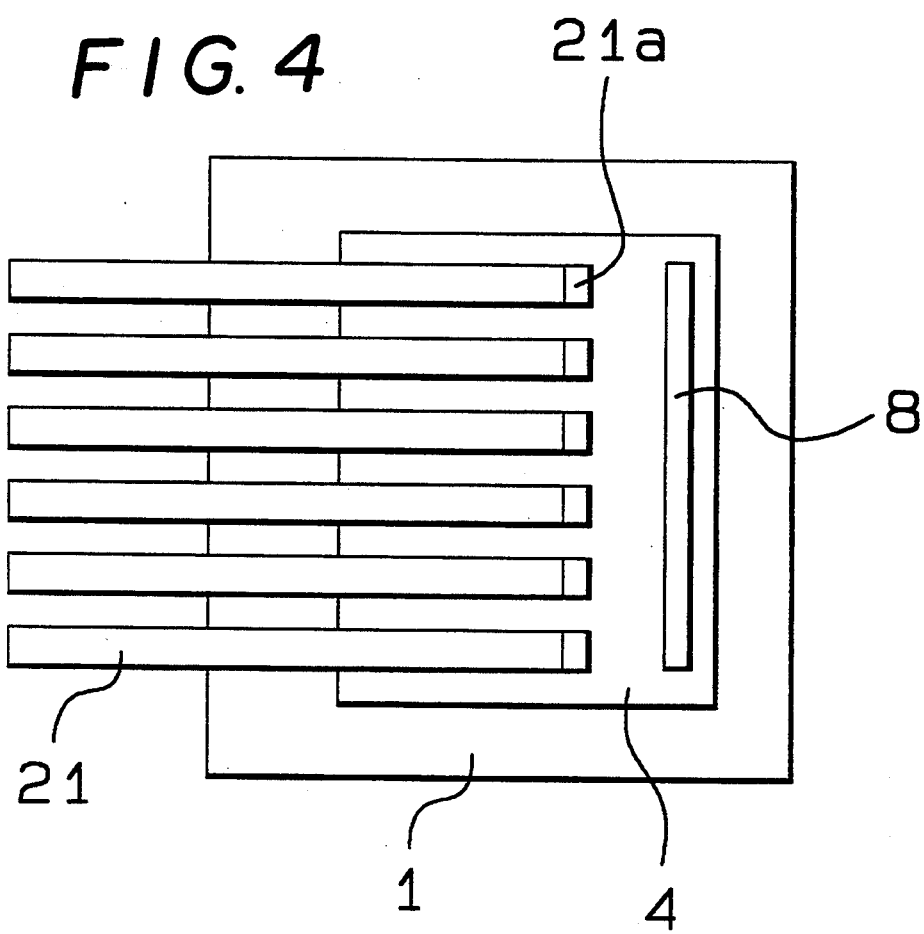
FIG. 4 is a plan view illustrating the structure of a sample used for an adhesive strength test and a leakage current test.
Figure 5:
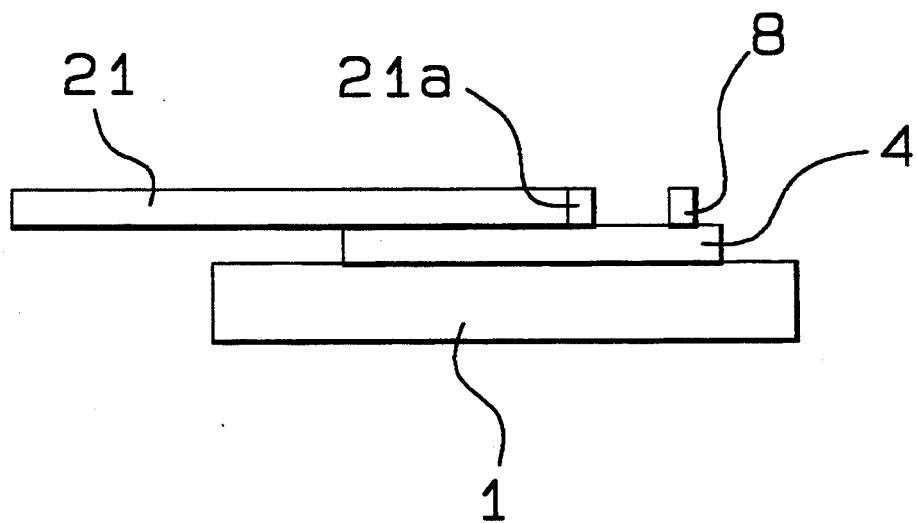
FIG. 5 is a side view illustrating the sample shown in FIG. 4.
Figure 6:
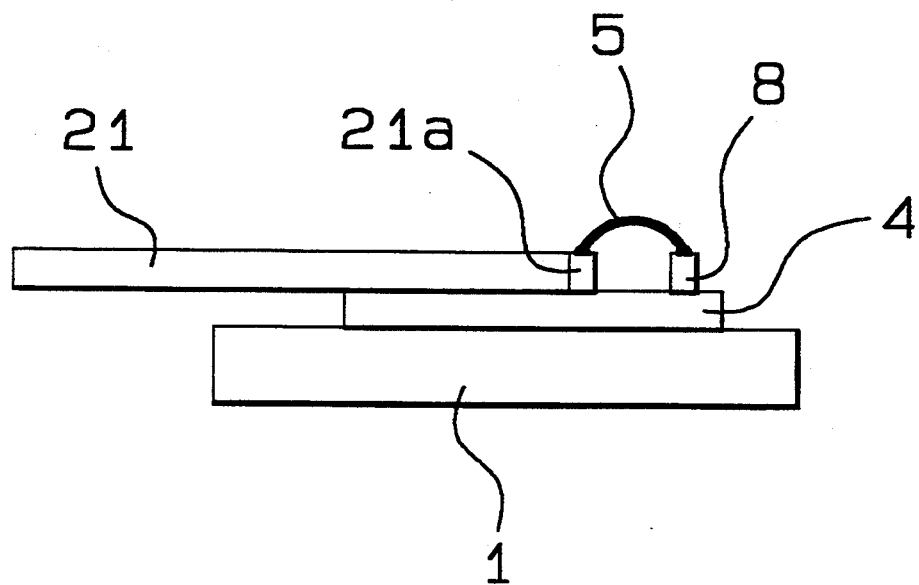
FIG. 6 is a cross-sectional view illustrating the structure of a sample for a wire bond test.

The insulating adhesive tape 4 was tested using the device shown in FIGS. 4, 5, and 6. As shown in these figures, the insulating adhesive tape 4 is adhered onto the IC chip 1 on which some leads 21 of lead frame 2 and a single test bar 8 for wire bonding are bonded. In the figures, numeral 21a represents a silver plated portion of the lead 21. In order to perform a wire bonding test, as shown in FIG. 6, a gold wire 5 connects the silver plated portion 21a of the lead 21 to the test bar 8.

The following test results are obtained by using the above test devices.

A further detail explanation will be made as for preferred embodiments of the insulating adhesive tape according to the present invention.

A polymer with an imide bond may be used as a material for the insulating film 41.

Such a material may be exemplified as follows: a polyimide film including Regulus (a trademark of Mitsui Toatsu Chemicals, Inc.) Kapton H, V, E, K and ZT (respectively, a trademark of Du Pont Co.), Upilex M, S, SGA, SGAPA (respectively, a trademark of Ube Industries, Ltd.), Apical AH, NPI (respectively, a trademark of Kanegafuchi Chemical Industry Co., Ltd.), or an aramid film such as Aramica (a trademark of Asahi Chemical Industry Co., Ltd.). In these materials, it is recommended to use a polyimide film with a low water absorbing capacity, particularly of, a material of Upilex S type and Kapton E type.

The thickness of the base film is not particularly limited. However, it is preferable that the thickness ranges from 1 to 500 μm, more preferably from 5 to 100μm.

Before a thermoplastic polymer layer containing a thermoplastic polyimide is formed on the base film, It is preferable to subject the surface of a substrate to a plasma treatment or ozone treatment. It is well-known to make rough physically the surface of a substrate by these treatments or to form chemically a functional group such as carboxyl radical on the same.

However, the treatment effect in the thermoplastic polymer layer of the present invention is remarkable beyond expectations. The adhesive strength to the substrate can be improved and stabilized largely.

A thermoplastic polymer layer is formed on the treated surface of the base film. For carrying out the present invention, it is important that the thermoplastic polymer forming the layer has a glass transition temperature ranging from 180° C. to 280° C., and has a modulus of elasticity ranging $10^{10}$ to $10^{11}$ dyne/cm$^2$ at 25° C., usually a modulus ranging $10^2$ to $10^9$ dyne/cm$^2$ at a wire bonding temperature ranging from 250° C. to 300° C.

The thermoplastic polyimide of PI-X, PI-Xh, PI-Y, PI-Yh, or PI-Z may be listed as a preferable thermoplastic polymer having the above mentioned properties.

If the glass transition temperature is less than 180° C. or the modulus is less than $10^2$ dyne/cm$^2$ at a wire bonding temperature, such a problem will occur that the inner lead is moved during wire bonding process or energy cannot properly be transferred to the inner lead in ultrasonic heating.

On the contrary, if the glass transition temperature is more than 280° C. or the modulus is more than $10^8$ dyne/cm$^2$ at the wire bonding temperature, it will-hake much time to perform thermo-melting-bonding for-the lead frame and IC chip, whereby it is difficult to execute a short time bonding.

In order to embody the present invention, it is desirable that the amount of the solvent contained within the thermoplastic polymer layer formed over the base film is not more than 1% and that the imide reaction of the thermoplastic polyimide has been substantially completed. This can prevent the solvent volatilization or the volatilization of moisture produced due to an imidization chemical reaction during the short time thermo-melting-bonding at high temperature (generally, over 270° C.) from contaminating the surface of the lead frame or IC chip, or producing void in the adhesive layer.

When the surface of IC chip to be adhered with an insulating adhesive tape, is covered with a ceramic such as silicon nitride or a glass such as phosphor-borosilicate glass, it is important that a silane coupling agent is mixed and reacted at the time when the thermoplastic polyimide coated over the base film is synthesized, or is mixed after the synthesizing process.

The silane coupling agent such as followings may be recommended: that is, epoxy silane, thiol silane, amino silane (KBM-403, KBM-803, KBM-602, KBM-573 and so on, manufactured by Shin-Etsu Chemical Co., Ltd.), particularly, KBM-403 and KBM-803 is preferable.

In this case, the amount of the silane coupling agent to be used ranges from not less than 0.5% by weight of the thermoplastic polyimide to not more than 4% by weight thereof, preferably from more than 1% by weight thereof to less than 3% by weight thereof.

The amount of the silane coupling agent of less than 0.5% or more than 4% is not preferable because the humidity resistant adhesive strength to a ceramic or glass is poor, or the volatilization of an excessive silane coupling agent during the thermo-melting-bonding process at high temperature may contaminate the lead frame.

In this case, because of reasons similar to those mentioned above, the necessary requirements are that the glass transition temperature of the thermoplastic polymer ranges from 180° C. to 280° C. and the modulus of elasticity ranges from $10^{10}$ to $10^{11}$ dyne/cm$^2$ at 25° C., and from $10^2$ to $10^9$ dyne/cm$^2$ at a wire bonding temperature.

The ionic impurities of sodium, potassium, chlorine, sulphate ion etc. in the thermoplastic polymer is trace or about 1 $\mu$ g/g (by the hydrothermal extracting method, it was calculated based on the amount of ions extracted from a water at 120° C. for 24 hours).

For that reasons, it does not occur that electronic circuits around the insulating adhesive tape used for adhesion are eroded by ionic impurities within the tape or the metal migration makes the short circuited.

Since the amount of the radioactive element such as uranium, thorium causing software error in a semiconductor memory is less than the detection limit of a radioactivation analyzer i.e. less than 0.6 ppb, the reliability of the semiconductor memory can be maintained at a very higher level for long period.

The water absorbing ratio of the thermoplastic polymer is less than 1.2% (after immersing in a pure water at 23° C. for 24 hours). Since the value is ½ to 1/5 of that of polyether amide and polyether amide-imide generally used, the void formation can be largely decreased be caused by possible water vapor during an adhering process under high temperature.

The thermoplastic polymer layer comprising a thermoplastic polyimide can be formed by coating a polyimide acid varnish containing a polyamide acid (as a polyimide precursor), a polyimide varnish containing polyimide, or a polyimide varnish containing a polyimide acid and silane coupling agent which is mixed and reacted when polyamide acid is synthesized, or is mixed after the synthesizes process, and then drying the coated layer to imidize the polyamide acid.

Moreover, before the varnish is coated on the base film, the vanish, if necessary, may be mixed with a filler such as silica which does not contain a radio-active element such as uranium and thorium, or an epoxy resin such as EOCN-1027 (a trademark of Nippon Kayaku Co., Ltd.). It is necessary that the thermoplastic polymers contain a thermoplastic polyimide of not less than 50% by weight, preferably not less than 75%, more preferably not less than 90%, still more preferably not less than 96%.

The thermoplastic polymer layers are particularly not limited to the thickness thereof. However it is desirable that the thickness ranges from more than 1$\mu$m to less than 100$\mu$m, preferably from more than 3 $\mu$m to less than 50 $\mu$m.

Well-known devices such as a comma(,)-type coater, a three reverse coater, a die coater may be used for coating. In the drying and imidizing method, a conventional roll carrying drier may be used when the thermoplastic polymer layer is formed on one surface of the base film. A floating drier may be recommended when a thermoplastic polymer is formed on the both surfaces of the base film.

When the amount of the solvent contained within the thermoplastic polymer layer is not more than 15% by weight, it is preferable to dry using a drier having a far infrared heater arranged between support rollers spaced by 1 to 5 m from each other in order to improve the adhesive property between the thermoplastic polymer layer and the semiconductor material.

Generally, the drying conditions depends on the thickness of tile thermoplastic polymer, the concentration of a varnish and the drying method. For example, when the varnish has its concentration of 25% and its thickness of 25 $\mu$m after drying, the drying is generally performed for 2 to 30 minutes at 100° to 150° C., 150 to 200° C., 200° to 250° C., or 250° to 300° C. Temperatures over a range of 300 to 400° C. can reduce the drying time to 10 minutes or less.

In order to reduce the amount of gas produced during a melting and pressing time, it is desirable that by these drying treatment to decrease the remaining solvent existing in the thermoplastic polymer layer to less than 1%, preferably to less than 0.1%, more preferably to less than 0.05%.

These drying processes converts the polyimide acid substantially into a polyimide. The drying is performed in a cleanness of less than 1000, preferably less than 100, if necessary, in a nitrogen atmosphere with the same cleanness.

A sheet of a width of 300 mm or more is usually used as the base film, and a thermoplastic polymer layer is formed thereon. Then the sheet is cut to form a tape with a width suitable for use.

The polyamide acid varnish or polyimide varnish, for example, is manufactured as follows:

First, a polyamide acid varnish being a polyimide precursor is prepared by solving an aromatic diamine in a polar solvent such as an N-methyl pyrrolidone, adding an aromatic tetracarboxylic acid anhydride within a range of 90 to 110% by equivalent ratio, and reacting them. This equivalent ratio is selected preferably to be within a range of 95 to 105%, more preferably to 97 to 102%.

Such amide acid polymer has a logarithmic viscosity $\eta$ of 0.3 to 3 dl/g (measured with an N, N-dimethylacetamide solvent medium of a concentration of 0.5 g/100 ml at 35° C.), preferably 0.5 to 1.5 dl/g.

The above mentioned PI-X, PI-Y, and PI-Z can be synthesized by performing the processes disclosed in Japanese Patent Application Laid-open Nos. SHO-61-291670 (1986), HEI-5-59344 (1993), and SHO-6268817 (1987, same as U.S. Pat. No. 4,847,349).

When a lower temperature, lower pressure adhering is needed, in order to improve the fluidity of the thermoplastic polyimide at the adhesive temperature a dicarboxylic acid anhydride expressed by the following formula (2): is used and to cap the amine on the terminal of the amide acid.

(2)

(where Z is a divalent radical selected from the group of monocyclic aromatic radical, condensed polycyclic aromatic radical, and non-condensed polycyclic aromatic radicals in which aromatic radicals are directly connected or mutually connected via cross linkers.) In this invention, said cross linkers mean cross linking agents such as, —CO— —O—, —S—, —SO$_2$—, —CH$_2$—C(CH$_3$)$_2$—, —C(CF$_3$)$_2$— and the like.

The dicarboxylic acid anhydride may be added at the earlier stage of the amide acid polymer producing process or after this process. The varnish of an amide acid polymer with the capped terminal of amine may be coated on the base film without any change. However, it is also recommended to coat a polyimide varnish made by heating a varnish to allow a thermal imidization reaction. The above mentioned PI-Xh and PI-Yh can be synthesized using the methods disclosed in Japanese Patent Application Laid-open Nos. HEI-4-111167 (1992) and HEI-5-59344 (1993).

With respect to PI-X, PI-Xh, PI-Y, PI-Yh and PI-Z, when the polyamide acid varnish or polyimide varnish is prepared, as long as the properties of the varnish after drying is within the range of glass transition temperatures and modolus of elasticity at high temperature specified according to the present invention, a part of the aromatic diamine, aromatic tetracarboxylic acid anhydride, and dicarboxylic acid anhydride being polyamide acid or polyamide component, can be substituted with another sort of aromatic diamine, aromatic tetracarboxylic acid anhydride, or dicarboxylic acid anhydride without any trouble.

Other diamines which can be used in combination include, for example, m-phenylenediamine, o-phenylenediamine, p-phenylenediamine, m-aminobenzylamine, o-aminobenzylamine, 3-chloro-1,2-phenylenediamine, 4-chloro-1,2-phenylenediamine, 2,3-diaminotoluene, 2,4-diaminotoluene, 2,5-diaminotoluene, 2,6-diaminotoluene, 3,4-diaminotoluene, 3,5-diaminotoluene, 2-methoxy-1,4-phenylenediamine, 4-methoxy-1,2-phenylenediamine, 4-methoxy-1,3-phenylenediamine, benzidine, 3,3'-dimethylbenzidine, 3,3'-dimethoxybenzidine, 3,3'-dichlorobenzidine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfoxide, 3,4'-diaminodiphenyl sulfoxide, 4,4'-diaminodiphenyl sulfoxide, 3,3'-diaminodiphenyl sulfone, 3,4'-diaminodiphenyl sulfone, 4,4'-diaminodiphenyl sulfone, 3,3'-diaminobenzophenone, 3,4'-diaminobenzophenone, 4,4'-diaminobenzophenone, 3,3'-diaminodiphenyl methane, 3,4-diaminodiphenyl methane, 4,4'-diaminodiphenyl methane, bis[4-(3-aminophenoxy)phenyl]methane, bis[4-(4-aminophenoxy)phenyl]methane, bis[3-(3-aminophenoxy)phenyl]methane, 1,1-bis[4-(4-aminophenoxy)phenyl]ethane, 1,2-bis[4-(4-aminophenoxy)phenyl]ethane, 1,1-bis[4-(3-aminophenoxy)phenyl]ethane, 1,2-bis[4-(3-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]propane, 1,2-bis[4-(3-aminophenoxy)phenyl]propane, 1,3-bis[4-(3-aminophenoxy)phenyl]propane, 2,2-bis[4-(3-aminophenoxy)phenyl]propane, 1,1-bis[4-(4-aminophenoxy)phenyl]butane, 1,2-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 1,1-bis[4-(3-aminophenoxy)phenyl]butane, 1,2-bis[4-(3-aminophenoxy)phenyl]butane, 1,3-bis[4-(3-aminophenoxy)phenyl]butane, 1,4-bis[4-(3-aminophenoxy)phenyl]butane, 2,2-bis[4-(3-aminophenoxy)phenyl]butane, 2,3-bis[4-(3-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5'-dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 2,2-bis[3-(4-aminophenoxy)phenyl]-1,1,1,3,3,3-hexafluoropropane, 2,2-bis[4-(3-aminophenoxy)phenyl]-1,1,1,3,3,3-hexafluoropropane, 2,2-bis[3-(3-aminophenoxy)phenyl]-1,1,1,3,3,3-hexafluoropropane, 1,3-bis(3-aminophenoxy)benzene, 1,3-bis(4-aminophenoxy)benzene, 1,4-bis(4-aminophenoxy)benzene, 1,4-bis(3-aminophenoxy)benzene, 4,4'-bis(3-aminophenoxy)biphenyl, 3,3'-bis(3-aminophenoxy)biphenyl, bis[3-(4-aminophenoxy)phenyl]ketone, bis[4-(4-aminophenoxy)phenyl]ketone, bis[4-(3-aminophenoxy)phenyl]ketone, bis[3-(3-aminophenoxy)phenyl]ketone, bis[4-(4-aminophenoxy)phenyl]sulfide, bis[3-(4-aminophenoxy)phenyl]sulfide, bis[3-(3-aminophenoxy)phenyl]sulfide, bis[4-(3-aminophenoxy)phenyl]sulfide, bis[4-(4-aminophenoxy)phenyl]sulfoxide, bis[4-(4-aminophenoxy)phenyl]sulfone, bis[3-(4-aminophenoxy)phenyl]sulfone, bis[3-(4-aminophenoxy)phenyl]sulfone, bis[4-(3-aminophenoxy)phenyl]sulfone, bis[4-(3-aminophenoxy)phenyl]ether, bis[4-(4-aminophenoxy)phenyl]ether, bis[3-(3-aminophenoxy)phenyl]ether, bis[3-(4-aminophenoxy)phenyl]ether, 1,4-bis[4-(3-aminophenoxy)benzoyl]benzene, 1,3-bis[4-(3-aminophenoxy)benzoyl]benzene, 1,4-bis[4-(4-aminophenoxy)benzoyl]benzene, 1,3-bis[4-(4-aminophenoxy)benzoyl]benzene, 4,4'-bis(3-aminophenoxy)-3-methylbiphenyl, 4,4'-bis(3-aminophenoxy)-3,3'-dimethylbiphenyl, 4,4'-bis(3-aminophenoxy)-3,5-dimethylbiphenyl, 4,4'-bis(3-aminophenoxy)-3,3',5,5'-tetramethylbiphenyl, 4,4'-bis(3-aminophenoxy)-3,3'-dichlorobiphenyl, 4,4'-bis(3-aminophenoxy)-3,5-dichlorobiphenyl, 4,4'-bis(3-aminophenoxy)-3,3',5,5'-tetrachlorobiphenyl, 4,4'-bis(3-aminophenoxy)-3,3'-dibromobiphenyl, 4,4'-bis(3-aminophenoxy)-3,5-dibromobiphenyl, 4,4'-bis(3-aminophenoxy)-3,3',5,5'-tetrabromobiphenyl, bis[4-(3-aminophenoxy)-3-methoxyphenyl]sulfide, [4-(3-aminophenoxy)phenyl][4-(3-aminophenoxy)-3,5-dimethoxyphenyl]sufide, bis[4-(3-aminophenoxy)-3,5-dimethoxyphenyl]sufide, and 1,3-bis[4-(4-aminophenoxy)-α,α-dimethylbenzyl]benzene.

These diamines can be used singly or as a mixture.

Exemplary dianhydrides include: ethylenetetracarboxylic dianhydride, butanetetracarboxylic dianhydride, cyclopentanetetracarboxylic dianhydride, pyromellitic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(2,3-dicarboxyphenyl)ether dianhydride, bis(3,4-dicarboxyphenyl)sulfone dianhydride, bis(2,3-dicarboxyphenyl)sulfone dianhydride, bis(2,3-dicarboxyphenyl)methane dianhydride. bis(3,4-dicarboxyphenyl)methane dianhydride. 1,1-bis(2,3-dicarboxyphenyl)ethane dianhydride, 1,1-bis(3,4-dicarboxyphenyl)ethane dianhydride, 1,2-bis(2,3-dicarboxyphenyl)ethane dianhydride, 1,2-bis(3,4-dicarboxyphenyl)ethane dianhydride, 1,3-bis(2,3-dicarboxyphenoxy)benzene dianhydride, 1,3-bis(3,4-dicarboxyphenoxy)benzene dianhydride, 1,4-bis(2,3-dicarboxyphenoxy)benzene dianhydride, 1,4-bis(3,4-dicarboxyphenoxy)benzene dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[4-(1,2-dicarboxy)phenoxy]benzene dianhydride, 1,4-bis[4-(1,2-dicarboxy)phenoxy]benzene dianhydride, 1,4-bis[3-(1,2-dicarboxy)phenoxy]benzene dianhydride, 1,3-bis[4-(1,2-dicarboxy)-α,α-dimethylbenzyl]benzene dianhydride, 1,3-bis[3-(1,2-dicarboxy)-α,α-dimethylbenzyl]benzene dianhydride, 1,4-bis[3-(1,2-dicarboxy)-α,α-dimethylbenzyl]benzene dianhydride, 1,4-bis[4-(1,2-dicarboxy)-α,α-dimethylbenzyl]benzene dianhydride, 2,2-bis[4-(4-(1,2-dicarboxy)phenoxy)phenyl]propane dianhydride, 2,2-bis[4-(3-(1,2-dicarboxy)phenoxy)phenyl]propane dianhydride, bis[4-(4-(1,2-dicarboxy)phenoxy)phenyl]ketone dianhydride, bis[4-(3-(1,2-dicarboxy)phenoxy)phenyl]ketone dianhydride, bis[4-(4-(1,2-dicarboxy)phenoxy)phenyl]sulfone dianhydride, bis[4-(3-(1,2-dicarboxy)phenoxy)phenyl]sulfone dianhydride, bis[4-(4-(1,2-dicarboxy)phenoxy)phenyl]sulfide dianhydride, bis[4-(3-(1,2-dicarboxy)phenoxy)phenyl]sulfide dianhydride, bis[4-(4-(1,2-dicarboxy)phenoxy)phenyl]-1,1,1,3,3,3-hexafluoropropane dianhydride and bis[4-(3-(1,2-dicarboxy)phenoxy)phenyl]-1,1,1,3,3,3-hexafluoropropane dianhydride, These aromatic tetracarboxylic dianhydrides can be used singly or as a mixture.

Aromatic diamine which can be used for the reaction includes, for example, bis[4-(3-aminophenoxy)phenyl]methane, 1,1-bis[4-(3-aminophenoxy)phenyl]ethane, 1,2-bis[4-(3-aminophenoxy)phenyl]ethane, 1,1-bis[4-(3-aminophenoxy)phenyl]propane, 1,2-bis[4-(3-aminophenoxy)phenyl]propane, 1,3-bis[4-(3-aminophenoxy)phenyl]propane, 2,2-bis[4-(3-aminophenoxy)phenyl]propane, 1,1-bis[4-(3-aminophenoxy)phenyl]butane, 2-bis[4-(3-aminophenoxy)phenyl]butane, 1,3-bis[4-(3-aminophenoxy)phenyl]butane, 1,4-bis[4-(3-aminophenoxy)phenyl]butane, 2,2-bis[4-(3-aminophenoxy)phenyl]butane, 2,3-bis[4-(3-aminophenoxy)phenyl]butane, 2,2-bis[4-(3-aminophenoxy)phenyl]-1,1,1,3,3,3-hexafluoropropane, 4,4'-bis(3-aminophenoxy)biphenyl, bis[4-(3-aminophenoxy)phenyl]ketone, bis[4-(3-aminophenoxy)phenyl]sulfide and bis[4-(3-aminophenoxy)phenyl]sulfone. These aromatic diamines can be used singly or as a mixture.

Exemplary aromatic dicarboxylic anhydrides of the formula (2) include phthalic anhydride, 2,3-benzophenonedicarboxylic anhydride, 3,4-benzophenonedicarboxylic anhydride, 2,3-dicarboxyphenyl phenyl ether anhydride, 3,4-dicarboxyphenyl phenyl ether anhydride, 2,3-biphenyldicarboxylic anhydride, 3,4-biphenyldicarboxylic anhydride, 2,3-dicarboxyphenyl phenyl sulfone anhydride, 3,4-dicarboxyphenyl phenyl sulfone anhydride, 2,3-dicarboxyphenyl phenyl sulfide anhydride, 3,4-dicarboxyphenyl phenyl sulfide anhydride, 1,2-naphthalenedicarboxylic anhydride, 1,8-naphthalenedicarboxylic anhydride, 1,2-anthracenedicarboxylic anhydride, 2,3-anthracenedicarboxylic anhydride and 1,9-anthracenedicarboxylic anhydride.

Solvent which can be used include, for example, N-methyl-2-pyrrolidone, N,N-dimethylacetamide, N,N-dimethylformamide, 1,3-dimethyl-2-imidazolidinone, N,N-diethylacetamide, N,N-dimethylmethoxyacetamide, dimethyl sulfoxide, pyridine, picoline, dimethyl sulfone, hexamethylphosphoramide, tetramethyl urea, N-methylcaprolactam, butyroractum, tetrahydrofuran, 1,3-dioxane, 1,4-dioxane, 1,2-dimethoxyethane, bis(2-methoxyethyl) ether, 1,2-bis(2-methoxyethoxy)ethane, bis[2-(2-methoxyethoxy) ethyl]ether, o-cresol, m-cresol, p-cresol, cresylic acid, p-chlorophenol and anisole. These solvents can be used singly or as a mixture.

Explanation will be made below as for how the insulating tape thus formed is used.

The insulating adhesive tape and electronic components such as lead frames and IC chips can be adhered with each other by a well-known thermo-melting press-bonding method.

The adhesive temperature is selected within the range of from 250° C. to 450° C., and particularly from 270° C. to 400° C. The adhesive time is particularly not limited but it is desirable to shorten the adhesive time as much as possible, usually to a range of 0.1 to 10 seconds, preferably to a range of 0.1 to 5 seconds. It is desirable to set the adhesive pressure to 1 to 50kg/cm$^2$, preferably to 5 to 30 kg/cm$^2$.

In the material such as copper-series lead frame which is subjected to an oxidizing reaction at high temperature and form easily a brittle oxidized film thereon, it is desirable that an oxigen concentration in an ambient of the thermo-melting press-bonding is set to less than 4%, preferably to less than 1%, to thus prevent an formation of an oxide layer.

In the insulating adhesive tape according to the present invention, since the thermoplastic polymer has an excellent adhesive property to a semiconductor material and its glass transition temperature is not less than 180° C. (which is higher than 175° C. of usual molding temperature of resin encapsulating material), superior moldability is given during resin encapsulating process with no deformation nor flow at thermoplastic nor being made. The glass transition temperatures as high as 180°~280° C. provide very good thermo-melting press-bonding conditions for industrial production. The modulus of elasticity as low as $10^2$ to $10^9$ dyne/cm$^2$ at 250° to 300° C. does not allow slightest movement of inner lead during the wire bonding step where an inner lead is wired with an IC chip at 240° to 280° C., thereby excellent reliability for bonding can be assured.

Moreover, the good bond is secured between an inner lead and an IC chip during a reflow soldering process.

In order to confirm the reliability for long service period an accelerating test was made in a pressure-cooker at 121° C. and a relative humidity of 90%, in which the insulating adhesive tape was not peeled from an IC lead frame and/or an IC chip at all. In addition, the separated of base film from the thermoplastic polymer was not observed.

In the insulating properties after adhering, the volume specific resistance is $10^{10}$ to $10^{18}$ Ω cm, and the surface resistance is $10^{10}$ to $10^8$, and the ionic impurities are very scarce. The severe accelerated aging test, where the sample is arranged in a pressure-cooker at 121° C. and a relative humidity of 90% and applied continuously with an DC voltage of 5 volts for 1000 hours, proved such an excellent electrical characteristic that the surface resistance falling ratio before and after the test is suppressed to less than 5%.

The examples for synthesizing the polyamide acid varnish and polyimide varnish are shown below:

EXAMPLE 1

14.6 g (0.05 mol) of 1,3-bis(3-aminophenoxy)benzene and 92.1 g of N, N-dimethylacetamide were introduced in a container equipped with an agitator, a reflux condenser, and a nitrogen introducing pipe. Then 16.0 g (0.0495 mol) of 3,3',4,4-benzophenonetetracarboxylic acid dianhydride was divided into four portions and added into the container under a nitrogen atmosphere at a room temperature and the mixture was stirred for 20 hours at a room temperature. The logarithmic viscosity η of the resultant polyamide acid was 0.95 dl/g.

EXAMPLE 2

36.8 g (0.1 mol) of 4,4'-bis(3-aminophenoxy)biphenyl and 137.6 g of N, N-dimethylacetamide were introduced in a container equipped with an agitator, a reflux condenser, and a nitrogen introducing pipe. Then 10.36 g (0.0475 mol) of pyromellitic acid dianhydride and 13.97 g (0.0475 mol) of 3,3',4,4'-biphenyltetracarboxylic acid dianhydride were added little by little into the container under a nitrogen atmosphere at a room temperature. The mixture was agitated for 20 hours at a room temperature. The logarithmic viscosity η of the resultant polyamide acid was 0.55 dl/g.

EXAMPLE 3

36.8 g (0.1 mol) of 4,4'-bis(3-aminophenoxy)biphenyl and 175.8 g of N, N-dimethylacetamide were introduced in a container equipped with an agitator, a reflux condenser, and a nitrogen introducing pipe. Then 21.5 g (0.1 mol) of pyromellitic acid dianhydride was added little by little into the container under a nitrogen atmosphere at a room temperature. The mixture was agitated for 20 hours at a room temperature. The logarithmic viscosity η of the resultant polyamide acid was 1.45 dl/g.

EXAMPLE 4

292.2 g (1.0 mol) of 1,3-bis(3-aminophenoxy)benzene and 1838.4 g of N-methyl-2-pyrolidone were introduced in a container equipped with an agitator, a reflux condenser, and a nitrogen introducing pipe, and agitated under a nitrogen atmosphere at a room temperature to dissolve. 320.59 g (0.995 mol) of 3,3',4,4'-benzophenonetetracarboxylic acid dianhydride was added little by little into the container. The resultant mixture was risen up to 50° C. and then agitated for one hour. Then 4.434 g (0.03 mol) of phthalic acid anhydride was added to the mixture little by little and then agitated for further two hours at 50° C. 93.1 g (0.1 mol) of γ-picoline was added into the resultant polyamide acid solution and then heated while being stirred in a flow of nitrogen. During heating, water produced with an imide reaction was removed out of the system. While the mixture was maintained at 180° C. for 5 hours to imidate thermally, the produced water and the reacted solvent carried by a flow of nitrogen were partially removed out of the system. Then the heating was stopped. The product was cooled to a room temperature for about two hours while stirring. Then the product was stirred continuously for 10 hours.

The viscosity of the resultant polyimide varnish was 60 poise (at 25° C., E-type viscometer) and its logarithmic viscosity η was 0.55 dl/g.

EXAMPLE 5

36.8 g (0.1 mol) of 4,4'-his(3-aminophenoxy)biphenyl and 137.6 g of N,N-dimethylacetamide were introduced in a container equipped with an agitator, a reflux condenser, and a nitrogen introducing pipe. Under a nitrogen atmosphere at a room temperature, 10.36 g (0.0475 mol) of pyromellitic acid dianhydride and 13,97 g (0.0475 mol) of 3,3',4,4'-biphenyltetracarboxylic acid dianhydride were added little by little into the container. The resultant mixture was heated to 50° C. and stirred for one hour. Then after 0.886 g (0.006 mol) of phthalic anhydride was added in the solution, the mixture was agitated at 50° C. for further 2 hours. Then, 9.31 g (0.01 mol) of γ-picoline was added to the resultant polyamide acid solution and was heated while being stirred in a flow of nitrogen. During heating, water produced with an imide reaction was removed out of the system. The product is maintained at 180° C. for 5 hours to imidate thermally. During this step, produced water and reacted solvent carried by the nitrogen flow were partially removed out of the system. Then the heating was stopped and the product was cooled to a room temperature in about two hours while stirring. Then the product was stirred for further 10 hours.

The viscosity of the resultant polyimide varnish was 80 poise (at 25° C., E-type viscometer) and its logarithmic viscosity η was 0.60 dl/g.

EXAMPLE 6

14.6 g (0.05 mol) of 1.3-bis(3-aminophenoxy)benzene and 92.1 g of N, N-dimethylacetamide were introduced in a container equipped with an agitator, a reflux condenser, and a nitrogen introducing pipe. 14.4 g (0.0446 mol) of 3,3',4,4'-benzophenonetetracarboxylic acid dianhydride were divided into three portions and then added in nitrogen atmosphere at a room temperature. The mixture was stirred for two hours at room temperature. Then, 0.61 g of KBM-403 (manufactured by Shinetsu Chemical Co., Ltd.), epoxy series silane coupling agent, was added to the solution and stirred for 20 hours at a room temperature. Then, 1.4 g (0.0044 mol) of 3,3',4,4'-benzophenonetetracarboxylic acid dianhydride was added to the solution and then stirred for 4 hours at room temperature. The logarithmic viscosity η of the resultant silane coupling agent denatured polyamide acid was 0.85 dl/g.

EXAMPLE 7

25.8 g (0.07 mol) of 4,4-bis(3-aminophenoxy)biphenyl and 6.0 g of 4,4-dimaminodiphenylether were introduced in a container equipped with an agitator, a reflux condenser, and a nitrogen introducing pipe. Then 21.5 g (0.1 mol) of pyromellitic dianhydride was added little by little into the container under a nitrogen atmosphere at a room temperature. The mixture was stirred for 20 hours. The logarithmic viscosity h of the resultant polyamide acid was 1.30 dl/g.

EXAMPLE 8

138.7 g (0.47 mol) of 1,3-bis(3-aminophenoxy)benzen, amine-terminated polydimethylsiloxane(TORAY DOW CORNING SILICONE Co. By-16853) and 998 g of N, N-dimethylacetamide were introduced in a container equipped with an agitator, a reflux condenser, and a nitrogen introducing pipe. Then 162 g (0.05 mol) of 3,3'-benzophenonetetracarboxylic acid dianhydride was added little by little into the container under a nitrogen atmosphere at a room temperature. The mixture was stirred for 20 hours. The logarithmic viscosity h of the resultant polyamide acid was 0.45 dl/g.

Insulating adhesive tapes were manufactured by using the varnish obtained by the above synthesis examples and various base films and were subjected to various tests. The test results are shown in the following Table.

The manufacturing method and the test results are described below. Some embodiments employ different conditions from those described below but the conditions are shown at the foot of the Table.

The varnish produced in the above synthesis example is coated over a base film. The sample is heated stepwise by 30° C. temperature from 100° C. to 250° C., while it is dried for 5 minutes in each step to imidate. Finally, a thermoplastic polyimide layer with a predetermined thickness is formed. Then, an adhesive insulating tape is prepared.

Under the same conditions as those described above, the thermoplastic polyimide used alone is processed into a film. The elastic modulus of the film is measured at 25° C. and 250° C. using VIBRON (trademark) visco-elastometer.

Sequentially, the insulating adhesive tape is cut into 10 mm square pieces. Each piece, as shown in FIGS. 4 and 5, is placed on a Si chip 1 coated with polyimide, and the leads 21 of a comb-type lead frame of 42 NiFe alloy is arranged on the piece. The structure is subjected to a thermo-press-bonding at 270° C. for 5 seconds at a pressure of 30kg/cm$^2$. The leads 21 are sheared out of the frame to form plural test samples M and S, as shown in FIGS. 4 and 5.

The lead frame used for testing are a comb-type lead frame with 16 leads. In the test sample M, the width of the lead is 0.3 mm and the gap between the leads is 0.3 mm. In the test sample S, the width of the lead is 0.15 mm and the gap between the leads is 0.15 mm. Each lead has a thickness of 0.15 mm and a silver plated portion at the area of 0.5 mm from the end.

Samples M were subjected to aging test for a 90-degree peeling strength. The test samples S were subjected to an aging test for an insulation. In order to perform an aging test for the 90-degree peeling strength, some test samples M was measured for the initial 90-degree peeling strength. Another test samples M were subjected to the 90-degree peeling strength test after they had been left for 1000 hours in a pressure-cooker which atmosphere has a temperature of 121° C. and a relative humidity of 90%.

Next, while a DC bias voltage of 5 volts were applied between adjacent leads of the test sample S, a leakage current flowing between the leads was measured. Next, while the 5 volt DC bias voltage applied between the leads, the corresponding sample was subjected to a 1000 hour aging under a condition of a temperature of 121° C. and a relative humidity of 90%. The leakage current of the sample was measured again after the aging.

In order to examine the strength characteristic of the wire bond, a test bar 8 was adhered to the test sample S, as shown in FIGS. 4 and 6, and the resultant structure was subjected to a wire bonding test. A bonding was carried out using a gold wire while an ultrasonic vibration is being applied under the condition of the stage temperature of 260° C. and a bonding load of 100 g. Thereafter, the positional deviation movement of lead 21 resulting from the bonding step was observed and bonding strength was measured.

Test results of insulating adhesive tapes with various structure are shown in the following Table.

| EMBODYMENT No. | No. 1 | No. 2 | No. 3 | No. 4 | No. 5 | No. 6 | No. 7 | No. 8 |
| --- | --- | --- | --- | --- | --- | --- | --- | --- |
| Base film | | | | | | | | |
| Grade | A | A | B | B | A | A | A | A |
| Tickness μm | 50 | 50 | 25 | 25 | 50 | 50 | 50 | 50 |
| Varnish | | | | | | | | |
| Syn. example No. | 1 | 1 | 1 | 1 | 1 | 1 | 1 | 1 |
| Drying Temp. °C. | 100–250 | 100–250 | 100–250 | 100–250 | 100–280 | 100–280 | 100–280 | 100–280 |
| Thermoplastic polyimide layer | | | | | | | | |
| Unit formula | (1) | (1) | (1) | (1) | (1) | (1) | (1) | (1) |
| Thickness μm | 10 | 10 | 10 | 10 | 25 | 25 | 10 | 10 |
| Trans. Temp. °C. | 200 | 200 | 200 | 200 | 220 | 220 | 220 | 220 |
| Elastic modulus | | | | | | | | |
| 25° C. | $4.4 \times 10^{10}$ | $4.4 \times 10^{10}$ | $4.4 \times 10^{10}$ | $4.4 \times 10^{10}$ | $4.4 \times 10^{10}$ | $4.4 \times 10^{10}$ | $2.5 \times 10^{10}$ | $4.4 \times 10^{10}$ |
| 250° C. | $4.0 \times 10^7$ | $4.0 \times 10^7$ | $4.0 \times 10^7$ | $4.0 \times 10^7$ | $2.0 \times 10^7$ | $2.0 \times 10^7$ | $2.0 \times 10^7$ | $2.0 \times 10^7$ |
| Width & gap of leads mm | 0.3 | 0.15 | 0.30 | 0.15 | 0.3 | 0.15 | 0.3 | 0.15 |
| Bonding condition | | | | | | | | |
| Pressure kg/cm$^2$ | 30 | 30 | 30 | 30 | 30 | 30 | 30 | 30 |
| Temperature° C. | 270 | 270 | 270 | 270 | 270 | 270 | 350 | 350 |
| Bonding time sec | 5 | 5 | 5 | 5 | 5 | 5 | 5 | 5 |
| Resistance against peeling | | | | | | | | |
| Initial Val. g | 28 | | 27 | | 24 | | 52 | |
| After aging g | 27 | | 27 | | 22 | | 52 | |
| Leakage current | | | | | | | | |
| Initial Val. nA | | 3 | | 4 | | 3 | | 3 |
| After aging nA | | 3 | | 4 | | 4 | | 3 |
| Bonding test | | | | | | | | |
| Stage temp. °C. | 230 | 230 | 230 | 260 | | | | |
| Bonding force g | 100 | 100 | 100 | 120 | | | | |
| Resistance g | 10 | 11 | 10 | 15 | | | | |
| Lead deviation | No | No | No | No | | | | |

| EMBODYMENT No. | No. 9 | No. 10 | No. 11 | No. 12 | No. 13 | No. 14 | No. 15 | No. 16 |
| --- | --- | --- | --- | --- | --- | --- | --- | --- |
| Base film | | | | | | | | |
| Grade | A | A | B | B | A | A | A | A |
| Tickness μm | 50 | 50 | 25 | 25 | 50 | 50 | 50 | 50 |
| Varnish | | | | | | | | |
| Syn. example No. | 2 | 2 | 2 | 2 | 2 | 2 | 3 | 3 |
| Drying Temp. °C. | 100–280 | 100–280 | 100–280 | 100–280 | 100–310 | 100–310 | 100–290 | 100–290 |
| Thermolplastic polyimide layer | | | | | | | | |
| Unit formula | (3) | (3) | (3) | (3) | (3) | (3) | (4) | (4) |

-continued

|  | | | | | | | | |
|---|---|---|---|---|---|---|---|---|
| Thickness μm | 10 | 10 | 10 | 10 | 10 | 10 | 10 | 10 |
| Trans. Temp. °C. | 230 | 230 | 230 | 230 | 230 | 230 | 270 | 270 |
| Elastic modulus | | | | | | | | |
| 25° C. | $2.5 \times 10^{10}$ | $2.5 \times 10^{10}$ | $2.5 \times 10^{10}$ | $2.5 \times 10^{10}$ | $3.7 \times 10^{10}$ | $3.7 \times 10^{10}$ | $4.2 \times 10^{10}$ | $4.2 \times 10^{10}$ |
| 250° C. | * | * | * | * | $2.0 \times 10^{7}$ | $2.0 \times 10^{7}$ | ** | ** |
| Width & gap of leads mm | 0.3 | 0.15 | 0.3 | 0.15 | 0.3 | 0.15 | 0.3 | 0.15 |
| Bonding condition | | | | | | | | |
| Pressure kg/cm² | 30 | 30 | 30 | 30 | 30 | 30 | 30 | 30 |
| Temperature °C. | 300 | 300 | 300 | 300 | 350 | 350 | 370 | 370 |
| Bonding time sec | 5 | 5 | 5 | 5 | 5 | 5 | 5 | 5 |
| Resistance against peeling | | | | | | | | |
| Initial Val. g | 40 | | 35 | | 65 | | 56 | |
| After aging g | 42 | | 37 | | 67 | | 58 | |
| Leakage current | | | | | | | | |
| Initial Val. nA | | 2.5 | | 2.9 | | 4 | | 2 |
| After aging nA | | 2.5 | | 2.9 | | 4 | | 2 |
| Bonding test | | | | | | | | |
| Stage temp. °C. | | 260 | | 260 | | 260 | | 270 |
| Bonding force g | | 100 | | 100 | | 100 | | 120 |
| Resistance g | | 11 | | 12 | | 15 | | 15 |
| Lead deviation | | | | | | | | |

| EMBODYMENT No. | No.17 | No.18 | No.19 | No.20 | No.21 | No.22 | No.23 | No.24 |
|---|---|---|---|---|---|---|---|---|
| Base film | | | | | | | | |
| Grade | C | C | A | A | A | A | D | D |
| Tickness μm | 50 | 50 | 50 | 50 | 20 | 20 | 50 | 50 |
| Varish | | | | | | | | |
| Syn. example No. | 4 | 4 | 5 | 5 | 6 | 6 | 1 | 1 |
| Drying Temp. °C. | 100–270 | 100–270 | 100–270 | 100–270 | ⊚ | ⊚ | 100–250 | 100–250 |
| Thermolplastic polyimide layer | | | | | | | | |
| Unit formula | PI-Xh | PI-Xh | PI-Yh | PI-Yh | | | (1) | (1) |
| Thickness μm | 10 | 10 | 10 | 10 | 8 | 8 | 10 | 10 |
| Trans. Temp. °C. | 230 | 230 | 235 | 235 | 205 | 205 | 200 | 200 |
| Elastic modulus | | | | | | | | |
| 25° C. | $1.0 \times 10^{10}$ | $1.0 \times 10^{10}$ | $4.0 \times 10^{10}$ | $4.0 \times 10^{10}$ | $3.9 \times 10^{10}$ | $3.9 \times 10^{10}$ | $4.4 \times 10^{10}$ | $4.4 \times 10^{10}$ |
| 250° C. | $7.0 \times 10^{2}$ | $7.0 \times 10^{2}$ | *** | *** | $3.0 \times 10^{6}$ | $3.0 \times 10^{6}$ | $4.0 \times 10^{4}$ | $4.0 \times 10^{4}$ |
| Width & gap of leads mm | 0.3 | 0.15 | 0.3 | 0.15 | 0.3 | 0.15 | 0.3 | 0.15 |
| Bonding condition | | | | | | | | |
| Pressure kg/cm² | 30 | 50 | 30 | 30 | 20 | 20 | 30 | 30 |
| Temperature °C. | 270 | 270 | 280 | 280 | 380 | 380 | 270 | 270 |
| Bonding time sec | 5 | 5 | 5 | 5 | 3 | 3 | 5 | 5 |
| Resistance against peeling | | | | | | | | |
| Initial Val. g | 35 | | 53 | | 48 | | 12 | |
| After aging g | 31 | | 47 | | 35 | | 10 | |
| Leakage current | | | | | | | | |
| Initial Val. nA | | 7 | | 6 | | 3 | | 4 |
| After aging nA | | 8 | | 7 | | 3 | | 5 |
| Bonding test | | | | | | | | |
| Stage temp. °C. | | 260 | | 270 | | 270 | | 230 |
| Bonding force g | | 80 | | 80 | | 100 | | 100 |
| Resistance g | | 11 | | 13 | | 13 | | 10 |
| Lead deviation | | | | | | | | |

| COMPARATIVE EMBODYMENT No. | No. 1 | No. 2 |
|---|---|---|
| Base film | | |
| Grade | A | C |
| Tickness μm | 50 | 50 |
| Varnish | | |
| Syn. example No. | 7 | 8 |
| Drying Temp. °C. | 100–320 | 100–250 |
| Thermolplastic polyimide layer | | |
| Unit formula | — | — |
| Thickness μm | 10 | 10 |
| Trans. Temp. °C. | 290 | 165 |
| Elastic modulus | | |
| 25° C. | $3.6 \times 10^{10}$ | $3.6 \times 10^{10}$ |
| 250° C. | $6.0 \times 10^{9}$ | $4.0 \times 10^{2}$ |
| Width & gap of leads mm | 0.3 | 0.15 |
| Bonding condition | | |
| Pressure kg/cm² | 30 | 20 |
| Temperature °C. | 400 | 280 |
| Bonding time sec | 5 | 3 |
| Resistance against peeling | | |
| Initial Val. g | 4 | |
| After aging g | 0 | |
| Leakage current | | |

-continued

| | |
|---|---|
| Initial Val. nA | |
| After aging nA | |
| Bonding test | |
| Stage temp. °C. | 260 |
| Bonding force g | 100 |
| Resistance g | 4 |
| Lead deviation | 30 μm |

Base film
A: Upilex SGAPA plasma treated UBE Industries, Ltd.
B: Aical NPI plasma treated KANEGAFUCHI Cemical Industry Co.,
C: Kapton E plasma treated TORAY-DUPONE Co. Ltd.
D: Upilex S not plasma treated UBE Industries, Ltd.
Unit of elastic modulus: dyne/cm$^2$
*: at 270° C., 3.0 × 10$^7$ dyne/cm$^2$
**: at 290° C., 3.0 × 10$^6$ dyne/cm$^2$
⊙ Film is heated at 250° C. with far-infrared rays heater, dried and converted to imide.
PI-X type silane coupling agent denatured thermoplastic polyimide
Aging condition: 85° C., 85% of relative humidity and 1,000 hours Protesting layer of Si chip: PI coating for Exmples 1 to 20, phosphouros glass membrane for Exmples 21 and 22.

As apparent from the above embodiments, the insulating adhesive tape according to the present invention can be adhered in very short time to the lead frame of resin encapsulated-type semiconductor devices, IC chips and heat spreaders. The excellent adhesive property and heat resistance can completely prevent the reduction of peeling strength and lead movement during the wire bonding process.

Furthermore, the insulating adhesive tape according to the present invention does not substantially exhibit adhesive strength decreasing and surface resistance decreasing after the 1000 hour durability test in a pressure-cooker being under the severe condition that the temperature is 121° C. and the relative humidity is 90%.

That is, according to the present invention, the adhesive performance can be largely improved to semiconductor material such as lead frame, IC chip, heat spreader, thus securing higher reliability to a long period service. The insulating adhesive tape also can make it possible to carry out bonding in a very short time operation, which is extremely important for the industrial filed.

What is claimed is:

1. An insulating adhesive tape which comprises a base supporting film and an adhesive layer formed on at least one surface thereof, said adhesive layer being formed of a thermoplastic polymer comprising a thermoplastic polyimide, wherein said thermoplastic polymer has a glass transition temperature ranging from 180° C. to 280° C. and an elastic modulus ranging from 10$^{10}$ dyne/cm$^2$ to 10$^{11}$ dyne/cm$^2$ at 25° C., said modulus including a value ranging from 10$^2$ dyne/cm$^2$ to 10$^9$ dyne/cm$^2$ at a temperature between 250° C. and 300° C.

2. An insulating adhesive tape according to claim 1, wherein said thermoplastic polymer has a glass transition temperature ranging from 180° C. to 240° C. and an elastic modulus ranging from 10$^2$ dyne/cm$^2$ to 10$^9$ dyne/cm$^2$ at 250° C.

3. An insulating adhesive tape according to claim 1, wherein said thermoplastic polymer has a glass transition temperature ranging from 200° C. to 260° C. and an elastic modulus ranging from 10$^2$ dyne/cm$^2$ to 10$^9$ dyne/cm$^2$ at 270° C.

4. An insulating adhesive tape according to claim 1, wherein said thermoplastic polymer has a glass transition temperature ranging from 250° C. to 280° C. and an elastic modulus ranging from 10$^2$ dyne/cm$^2$ to 10$^9$ dyne/cm$^2$ at a temperature between 270° C. and 300° C.

5. An insulating adhesive tape according to claim 1, further comprising the base supporting film having its surface subjected to a plasma treatment or ozon treatment.

6. An insulating adhesive tape according to claim 1, wherein said thermoplastic polymer comprises a silane-coupling-agent-modified thermoplastic polyimide.

7. An insulating adhesive tape according to claim 1, wherein said polyimide is consists of the structural unit expressed by the following formula (1):

$$\text{(1)}$$

8. An insulating adhesive tape according to claim 7, wherein said thermoplastic polyimide is capped with a dicarboxylic acid anhydride expressed by the following formula (2):

$$\text{(2)}$$

wherein Z is a bivalent radical selected from the group consisting of monocyclic aromatic radical, condensed polycyclic aromatic radical, and non-condensed polycyclic aromatic radical which is directly connected or mutually connected via cross linkers.

9. An insulating adhesive tape according to claim 1, wherein said thermoplastic polyimide is consists of the structural unit expressed by the following formula (3):

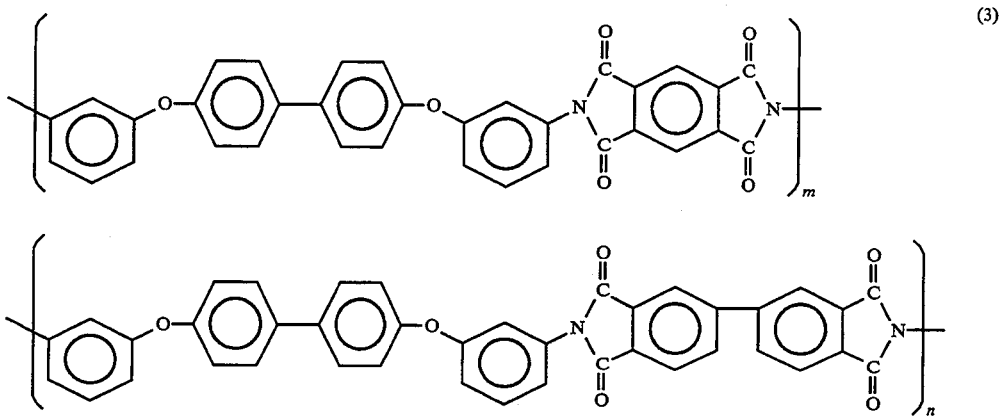

wherein m:n=1~90:99~10.

10. An insulating adhesive tape according to claim 9, wherein said thermoplastic polyimide is capped with a dicarboxylic acid anhydride expressed by the following formula (2):

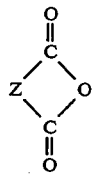
(2)

wherein Z has the same meaning as previously defined.

11. An insulating adhesive tape according to claim 1, wherein said thermoplastic polyimide consists of the structural unit expressed by the following formula (4):

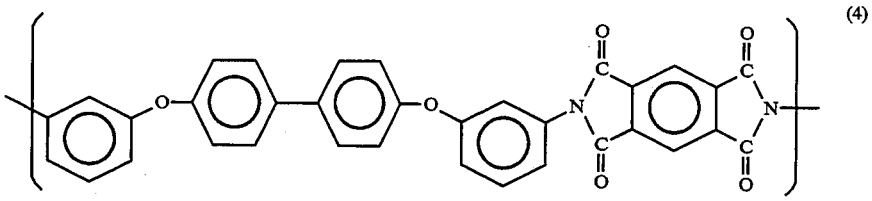

12. A lead frame having inner leads fixed with an insulating adhesive tape, comprising a base supporting film and and an adhesive layer formed on at least one surface thereof, said adhesive layer being formed of a thermoplastic polymer comprising a thermoplastic polyimide, said thermoplastic polymer having a glass transition temperature ranging from 180° C. to 280° C. and an elastic modulus ranging from $10^{10}$ dyne/cm$^2$ to $10^{11}$ dyne/cm$^2$ at 25° C., said modulus including a value ranging from $10^2$ dyne/cm$^2$ to $10^9$ dyne/cm$^2$ at a temperature between 250° C. and 300° C.

13. A lead frame according to claim 12, wherein said insulating adhesive tape fixing said inner leads includes adhesive layers on both surfaces thereof, each of said adhesive layers being formed of a thermoplastic polymer including a thermoplastic polyimide, one surface of said adhesive layer fixing said inner leads and the other surface of said adhesive layer being bondable with an IC chip or a heat spreader.

14. A semiconductor device wherein the inner leads of a lead frame is fixed with an insulating adhesive tape, said insulating adhesive tape having, on at least one surface of a base supporting film, an adhesive layer formed of a thermoplastic polymer comprising a thermoplastic polyimide, said thermoplastic polymer having a glass transition temperature ranging from 180° C. to 280° C. and an elastic modulus ranging from $10^{10}$ dyne/cm$^2$ to $10^{11}$ dyne/cm$^2$ at 25° C., said modulus ranging from $10^2$ dyne/cm$^2$ to $10^9$ dyne/cm$^2$ at least one temperature between 250° C. and 300° C., at least the portion of said inner leads fixed with said insulating adhesive tape being encapsulated with a resin.

15. A semiconductor device according to claim 14, wherein said semiconductor device is of a lead-on-chip type.

16. A semiconductor device according to claim 14, wherein said semiconductor device is of a type of a lead frame with a heat spreader.

* * * * *